(12) United States Patent
Chou et al.

(10) Patent No.: US 8,828,815 B2
(45) Date of Patent: Sep. 9, 2014

(54) METHOD FOR FABRICATING STRAINED-SILICON CMOS TRANSISTOR

(75) Inventors: Pei-Yu Chou, Tainan County (TW);
Shih-Fang Tzou, Hsinchu (TW);
Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 140 days.

(21) Appl. No.: 12/959,393

(22) Filed: Dec. 3, 2010

(65) Prior Publication Data

US 2011/0076814 A1    Mar. 31, 2011

Related U.S. Application Data

(62) Division of application No. 11/674,660, filed on Feb. 13, 2007, now Pat. No. 7,868,390.

(51) Int. Cl.
*H01L 21/8238* (2006.01)
*H01L 29/78* (2006.01)

(52) U.S. Cl.
CPC .... *H01L 21/823807* (2013.01); *H01L 29/7843* (2013.01)
USPC ........... 438/199; 438/275; 438/734; 438/736; 438/740

(58) Field of Classification Search
CPC ................. H01L 21/823807; H01L 29/7843; H01L 29/78; H01L 21/3185; H01L 29/518; H01L 29/7833; H01L 21/823871; H01L 21/823878; H01L 29/7842
USPC .................. 438/199–201, 275–276, 734–740
See application file for complete search history.

(56) References Cited

U.S. PATENT DOCUMENTS

| 7,227,205 | B2 | 6/2007 | Bryant | |
|---|---|---|---|---|
| 2003/0181005 | A1 | 9/2003 | Hachimine | |
| 2004/0113217 | A1 | 6/2004 | Chidambarrao | |
| 2005/0266639 | A1 | 12/2005 | Frohberg | |
| 2006/0091471 | A1* | 5/2006 | Frohberg et al. | 257/369 |
| 2006/0199326 | A1 | 9/2006 | Zhu | |
| 2007/0077741 | A1* | 4/2007 | Frohberg et al. | 438/586 |
| 2007/0090395 | A1 | 4/2007 | Sebe | |
| 2007/0108525 | A1* | 5/2007 | Yang et al. | 257/351 |

(Continued)

FOREIGN PATENT DOCUMENTS

| JP | 200680161 | 3/2006 |
|---|---|---|
| TW | 492184 | 6/2002 |
| TW | I305031 | 1/2009 |
| WO | 2005119760 A1 | 12/2005 |

*Primary Examiner* — H Tsai
(74) *Attorney, Agent, or Firm* — Winston Hsu; Scott Margo (57) ABSTRACT

First, a semiconductor substrate having a first active region and a second active region is provided. The first active region includes a first transistor and the second active region includes a second transistor. A first etching stop layer, a stress layer, and a second etching stop layer are disposed on the first transistor, the second transistor and the isolation structure. A first etching process is performed by using a patterned photoresist disposed on the first active region as a mask to remove the second etching stop layer and a portion of the stress layer from the second active region. The patterned photoresist is removed, and a second etching process is performed by using the second etching stop layer of the first active region as a mask to remove the remaining stress layer and a portion of the first etching stop layer from the second active region.

10 Claims, 14 Drawing Sheets

(56) References Cited

U.S. PATENT DOCUMENTS

| | | |
|---|---|---|
| 2007/0122982 A1 | 5/2007 | Chan |
| 2007/0202653 A1 | 8/2007 | Hoentschel |
| 2007/0205467 A1 | 9/2007 | Morioka |
| 2008/0026523 A1* | 1/2008 | Lee et al. ............ 438/231 |
| 2008/0173950 A1* | 7/2008 | Zhu et al. ............ 257/372 |

* cited by examiner

METHOD FOR FABRICATING STRAINED-SILICON CMOS TRANSISTOR

CROSS REFERENCE TO RELATED APPLICATIONS

This application is a division of U.S. application Ser. No. 11/674,660 filed Feb. 13, 2007, and incorporated herein by reference in its entirety.

BACKGROUND OF THE INVENTION

1. Field of the Invention

The invention relates to a method for fabricating a strained-silicon CMOS transistor.

2. Description of the Prior Art

As semiconductor technology advances and development of integrated circuits continues to revolution, the computing power and storage capacity enjoyed by computers also increases exponentially. As a result, this growth further fuels the expansion of related industries. As predicted by Moores Law, the number of transistors utilized in integrated circuits has doubled every 18 months and semiconductor processes also have advanced from 0.18 micron in 1999, 0.13 micron in 2001, 90 nanometer (0.09 micron) in 2003, to 65 nanometer (0.065 micron) in 2005.

As the semiconductor processes advance, determining methods for increasing the driving current for metal oxide semiconductor (MOS) transistors for fabrication processes under 65 nanometers has become an important topic. Currently, the utilization of high stress films to increase the driving current of MOS transistors is divided into two categories. The first category is that being a poly stressor formed before the formation of nickel silicides. The second category being a contact etch stop layer (CESL) formed after the formation of the nickel silicides.

Figure 1:
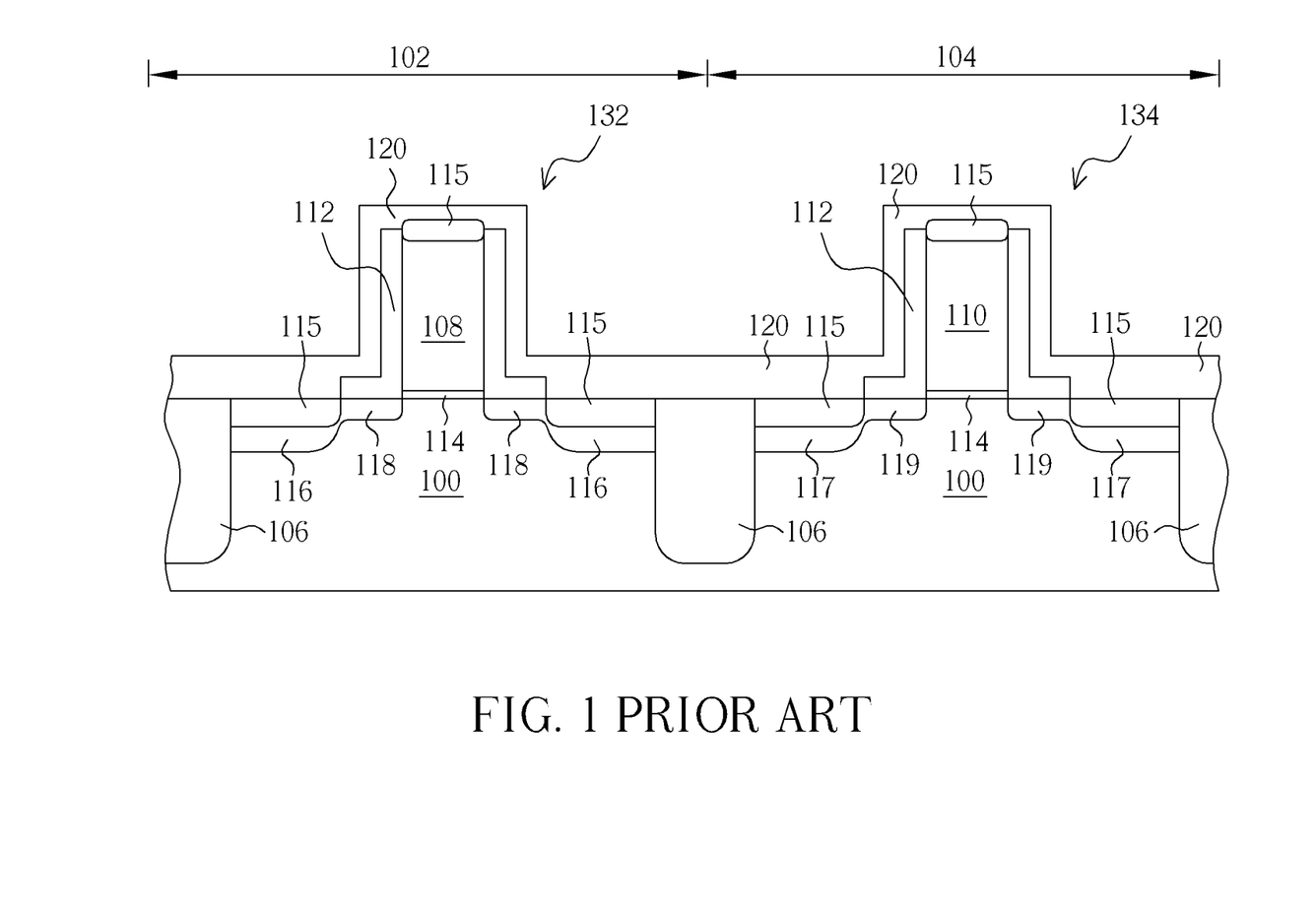
FIGS. 1-6 are perspective diagrams illustrating a method for fabricating dual contact etch stop layer on a strained-silicon CMOS transistor according to the prior art.

Please refer to FIGS. 1-6. FIGS. 1-6 are perspective diagrams illustrating a method for fabricating dual contact etch stop layer on a strained-silicon CMOS transistor according to the prior art. As shown in FIG. 1, a semiconductor substrate 100 having an NMOS region 102 and a PMOS region 104 is provided, in which the NMOS region 102 and the PMOS region 104 are divided by a shallow trench isolation 106. Each of the NMOS region 102 and the PMOS region 104 includes a gate structure. The NMOS gate structure includes an NMOS gate 108 and a gate dielectric 114 disposed between the NMOS gate 108 and the semiconductor substrate 100. The PMOS gate structure includes a PMOS gate 110 and a gate dielectric 114 disposed between the PMOS gate 110 and the semiconductor substrate 100. The sidewall of the NMOS gate 108 and the PMOS gate 110 includes a liner 112 composed of silicon dioxide or silicon nitride.

Next, an ion implantation process is performed to form a source/drain region 116 around the NMOS gate 108 and a source/drain region 117 around the PMOS gate 110 and within the semiconductor substrate 100. A rapid thermal annealing process is performed thereafter to utilize a temperature between 900° C. to 1050° C. to active the dopants within the source/drain region 116 and 117 for forming an NMOS transistor 132 in the NMOS region 102 and a PMOS transistor 134 in the PMOS region 104, and repair the lattice structure of the semiconductor substrate 100, which has been damaged during the ion implantation process. Additionally, a lightly doped drain (LDD) 118 and 119 can be formed between the source/drain region 116, 117 and the gate 108, 110.

Next, a metal layer (not shown), such as a nickel layer is sputtered on the surface of the semiconductor substrate 100, and a rapid thermal annealing process is performed to react the metal layer with the NMOS gate 108, the PMOS gate 110, and the source/drain region 116 and 117 to form a plurality of salicide layers 115. It is to be understood that the fabrication of the lightly doped rain, the source/drain extension, and the salicide layer relating to the present invention method is well known by those of average skill in the art and thus not further explained herein.

Figure 2:
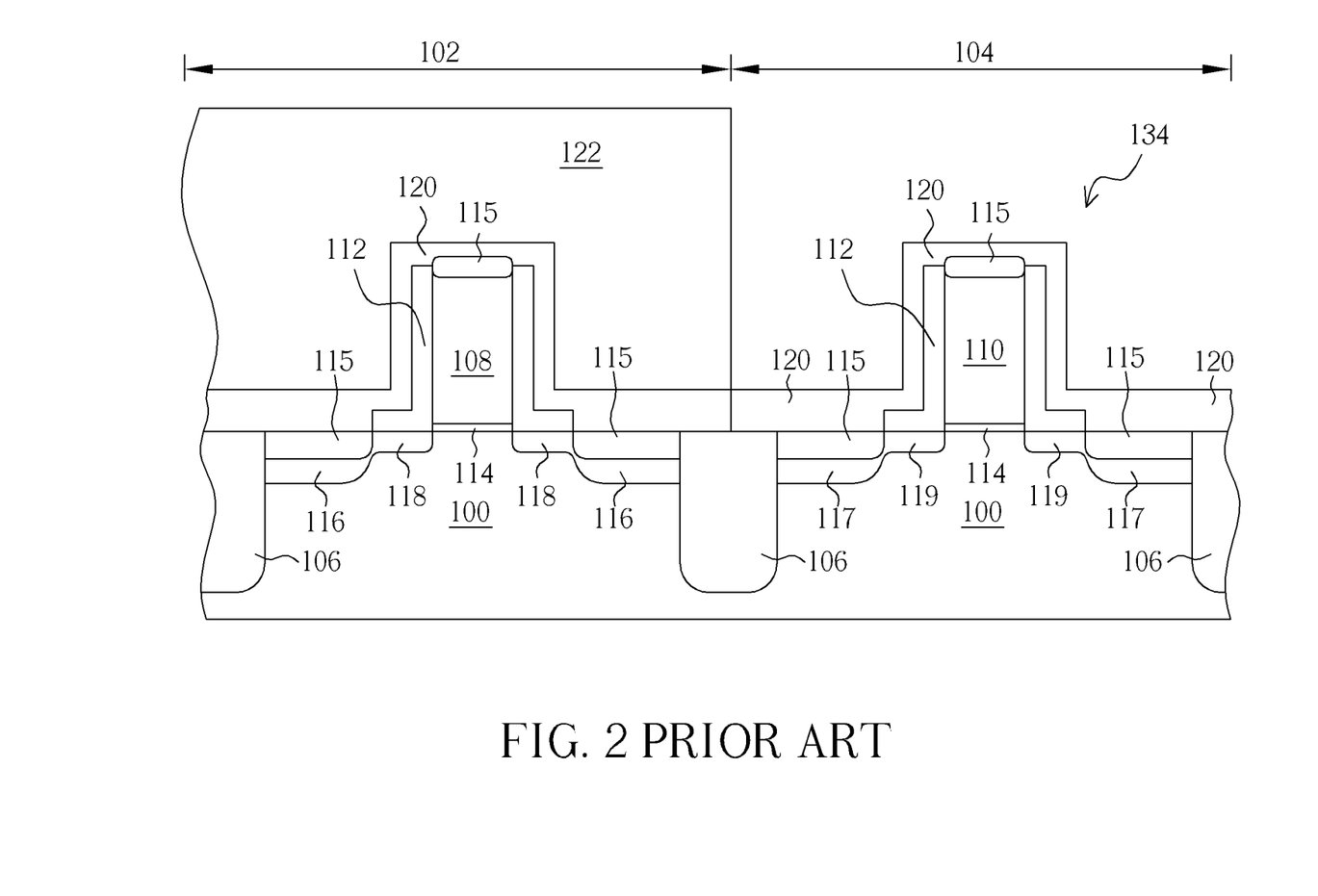

After the un-reacted metal layer is removed, a plasma enhanced chemical vapor deposition (PECVD) process is performed to form a high tensile stress film 120 over the surface of the salicide layers 115 within the NMOS region 102 and the PMOS region 104. Next, a series of coating, exposure, and development processes are performed to form a patterned photoresist 122 on the NMOS region 102.

Figure 3:
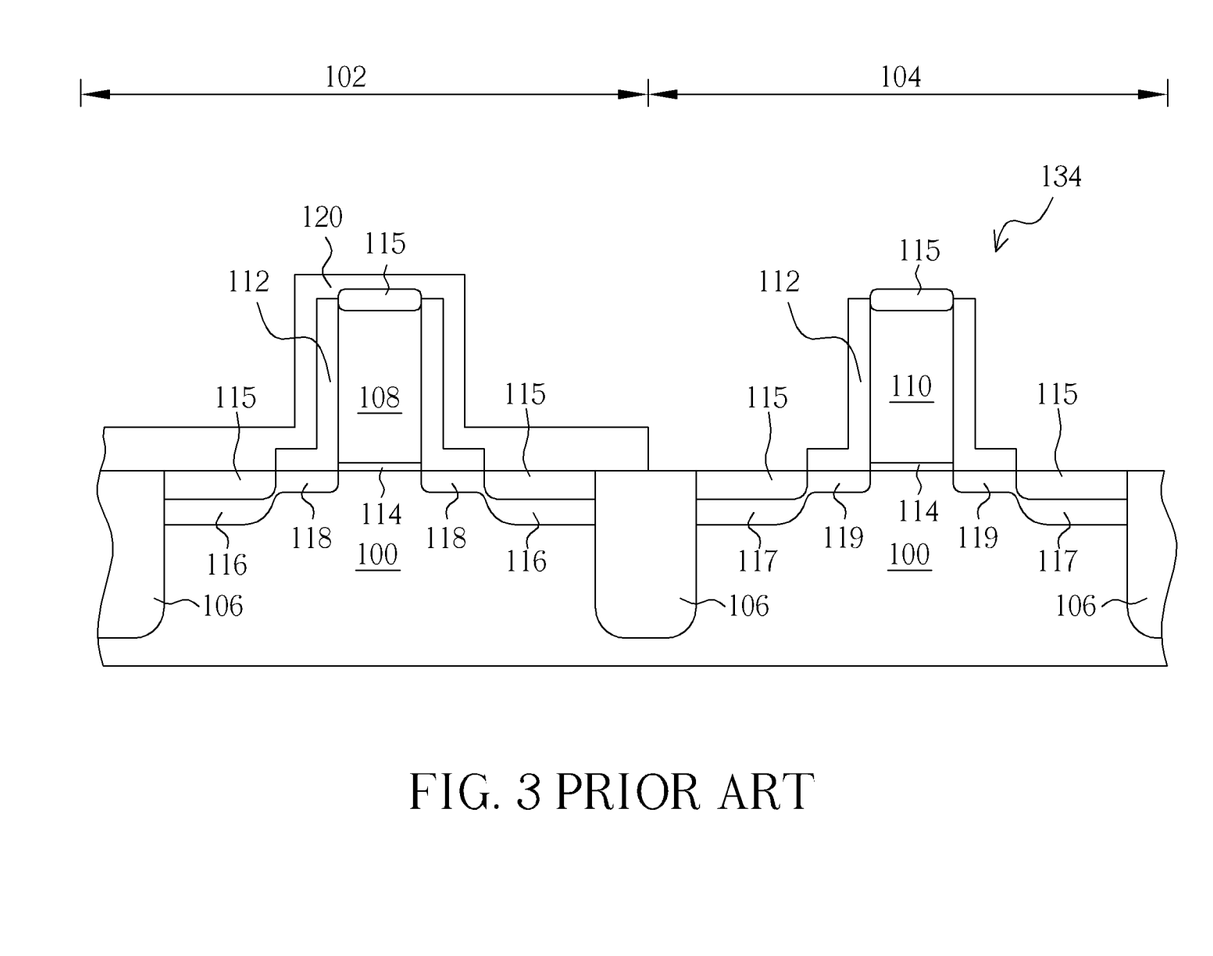

As shown in FIG. 3, an etching process is performed to remove the high tensile stress film 120 disposed on the PMOS region 104, thereby leaving a high tensile stress film 120 on the NMOS transistor 132. The patterned photoresist 122 is removed from the NMOS region 102 thereafter.

Figure 4:
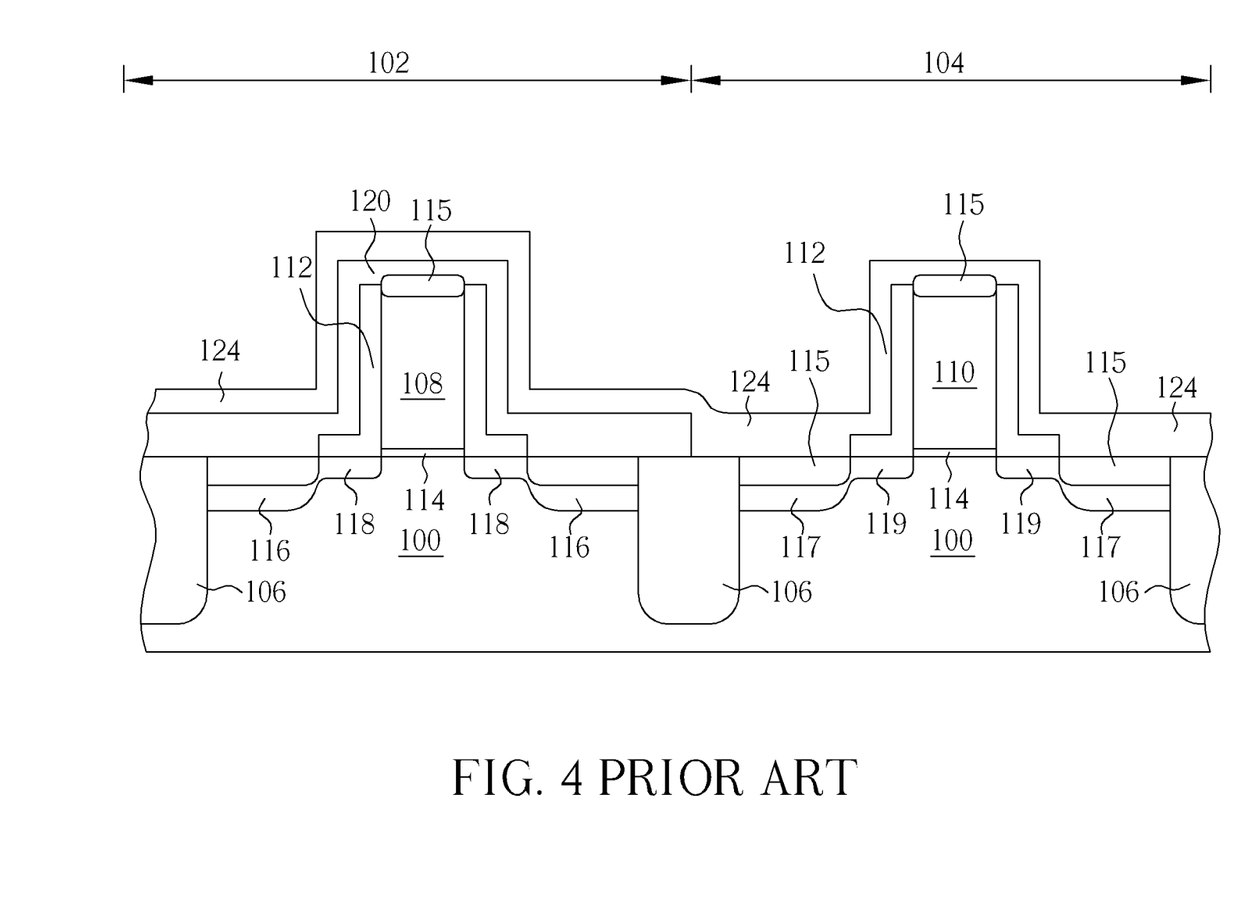

As shown in FIG. 4, another PECVD process is performed to form a high compressive stress film 124 on the MOS region 102 and the PMOS regions 104. Preferably, the high compressive stress film 124 is disposed on the high tensile stress film 120 in the NMOS region 102 and disposed on the PMOS transistor 134 in the PMOS region 104.

Figure 5:
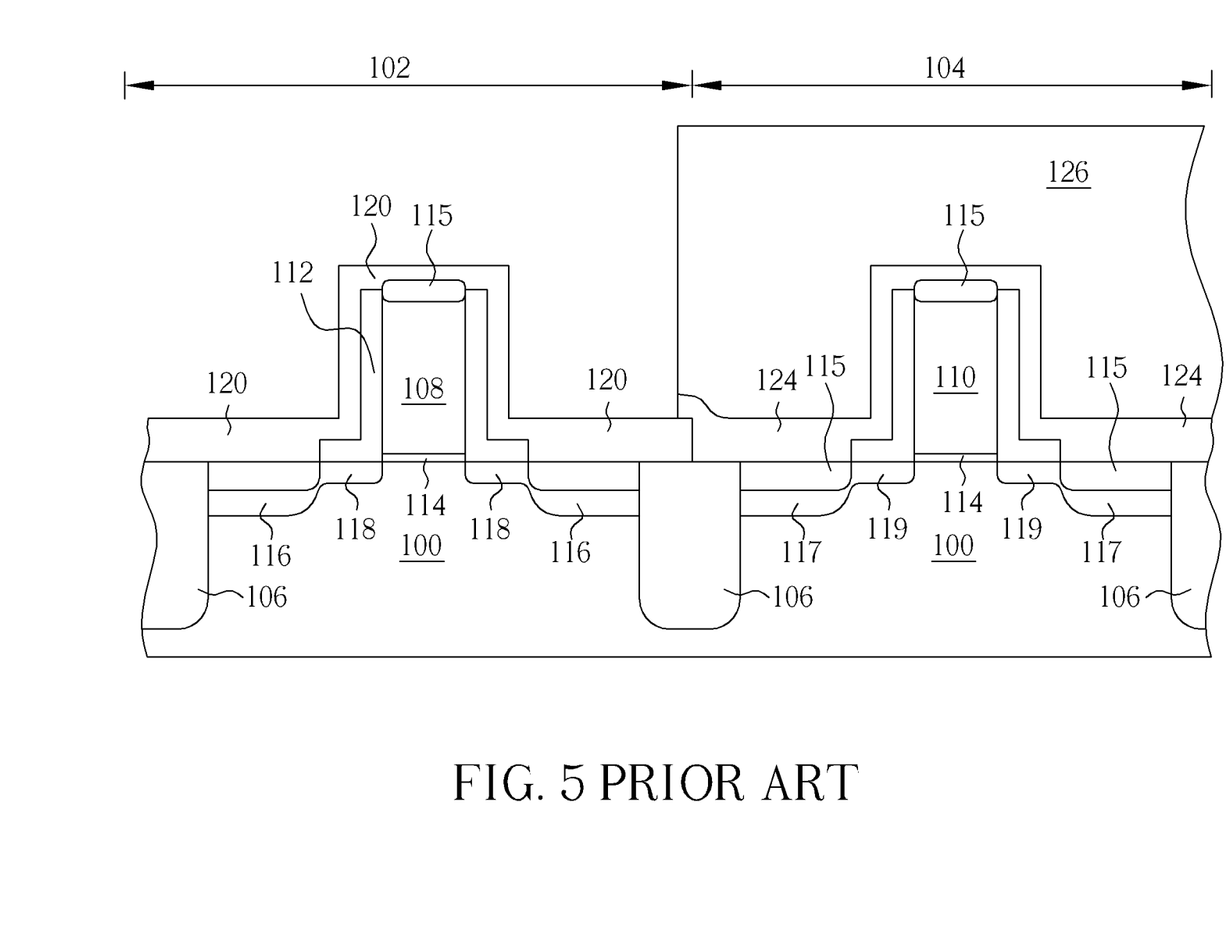

As shown in FIG. 5, a series of coating, exposure, and development processes are performed to form a patterned photoresist 126 on the PMOS region 104. Next, an etching process is performed by using the patterned photoresist 126 as a mask to remove the high compressive stress film 124 disposed on the NMOS region 102. The patterned photoresist 126 disposed on the PMOS region 104 is removed thereafter, thereby leaving a high compressive stress film 124 on the PMOS transistor 134 and a high tensile stress film 120 on the NMOS transistor 132.

Figure 6:
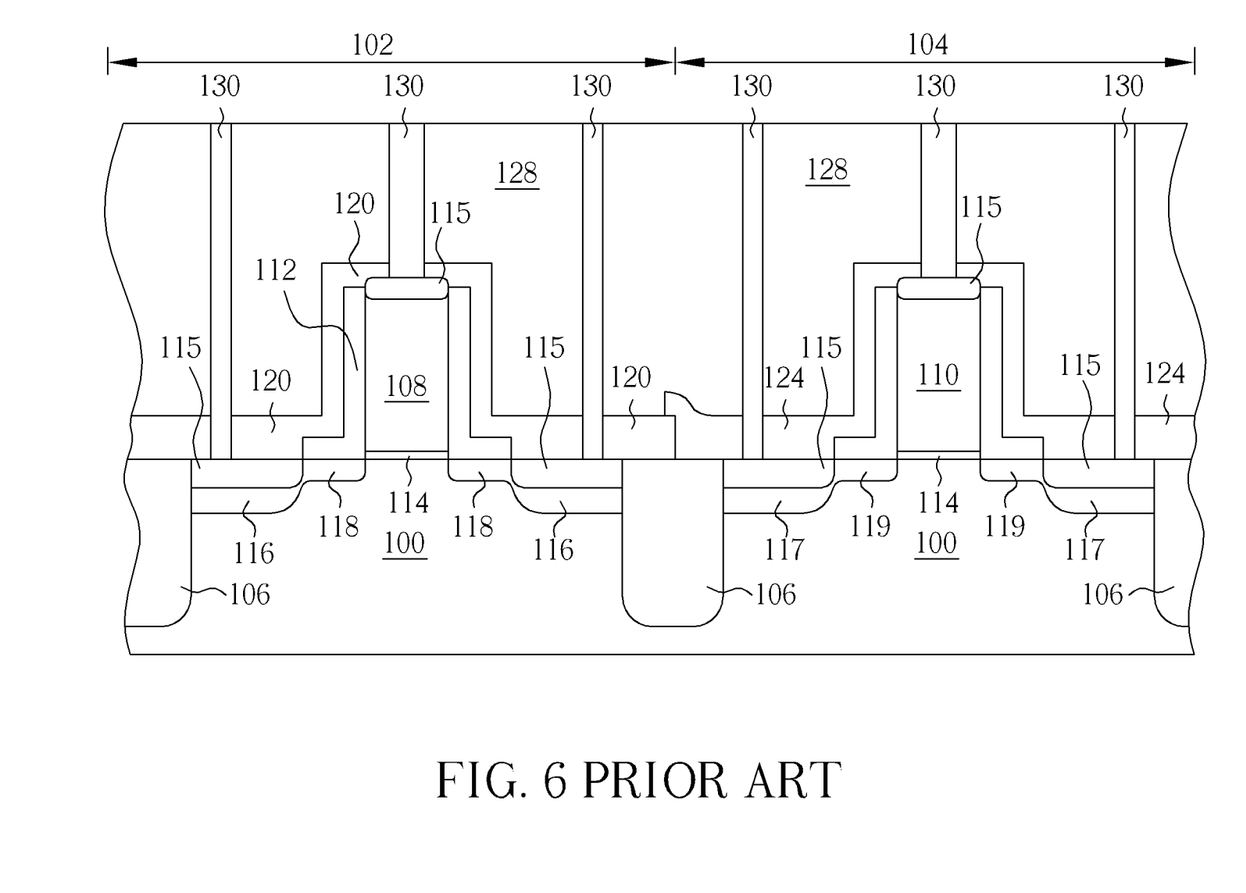

As shown in FIG. 6, an inter-layer dielectric 128 is disposed on the high tensile stress film 120 and the high compressive stress film 124. Next, an anisotropic etching process is performed by utilizing a patterned photoresist (not shown) as an etching mask and utilizing the high tensile stress film 120 and the high compressive stress film 124 as a contact etch stop layer to form a plurality of contact holes 130 in the inter-layer dielectric 128. The contact holes 130 are used as a bridge for connecting other electronic devices in the later process.

It should be noted that in the convention art, a patterned photoresist is formed on an active region, and an etching process performed thereafter by using the patterned photoresist as a mask to remove the stress layer disposed on another active region, as shown in FIGS. 2-3. This method removes the stress layer from the transistor rapidly, but also over-etches and damages the salicide layer disposed under the stress layer and ultimately influences the yield for fabricating contact holes in the later process.

Additionally, during the process for etching the high tensile stress film disposed on the NMOS transistor and the high compressive stress film disposed on the PMOS transistor, the definition of the region between the two stress layers is difficult and easily result in an overlapping phenomenon, as shown in FIG. 5, in which one stress layer is stacked on top of another. Typically, if the width of the overlapping region is less than 30 nm, a peeling phenomenon would result after the photoresist is stripped or a wet etching process is performed. If the width of the overlapping region of the two stress layers is greater than 30 nm, the peeling phenomenon is prevented but after a series of back end processes such as photoresist stripping or chemical mechanical polishing are performed, the overlapping region would break and result in defect of the device.

SUMMARY OF THE INVENTION

It is an objective of the present invention to provide a method for fabricating a strained-silicon CMOS transistor for solving the aforementioned problems.

A method for fabricating a strained-silicon CMOS transistor is disclosed. The method includes: providing a substrate having a first active region for fabricating a first transistor, a second active region for fabricating a second transistor, and an isolation structure disposed between the first active region and the second active region; forming a gate structure on the first active region and a second gate structure on the second active region; forming a source/drain region for the first transistor and a source/drain region for the second transistor; forming a first etching stop layer, a first stress layer, and a second etching stop layer on the first transistor, the second transistor, and the isolation structure; forming a first patterned photoresist on the second etching stop layer of the first active region; performing a first etching process to remove the second etching stop layer and a portion of the first stress layer of the second active region; removing the first patterned photoresist; and performing a second etching process by utilizing the second etching stop layer of the first active region as a mask to remove the remaining first stress layer of the second active region. Thereafter, a second stress layer is formed on the first etching stop layer of the second active region, in which a gap is formed between the first stress layer and the second stress layer. This completes the fabrication of a strained-silicon CMOS transistor.

According to another aspect of the present invention, a strained-silicon CMOS transistor is disclosed. The strained-silicon CMOS transistor includes: a substrate having a first active region for fabricating a first transistor, a second active region for fabricating a second transistor, and an isolation structure disposed between the first active region and the second active region; a first transistor, disposed on the first active region; a second transistor, disposed on the second active region; a first etching stop layer, disposed on the first transistor and the second transistor; a first stress layer, disposed on the first transistor; a second etching stop layer, disposed on the first transistor and the first stress layer; a second stress layer, disposed on the second transistor; and a third etching stop layer, disposed on the second transistor and the second stress layer. Preferably, the first stress layer and the second stress layer include a gap therebetween.

Preferably, the present invention forms a first etching stop layer, a stress layer, and a second etching stop layer on a first transistor and a second transistor, disposes a patterned photoresist on the first transistor, and uses the patterned photoresist as a mask to remove the second etching stop layer and a portion of the stress layer from the second transistor. After removing the patterned photoresist, the second etching stop layer on the first transistor is used as a mask to remove the remaining stress layer on the second transistor. In other words, in contrast to the conventional method of using a single step etching method, the present invention proposes a two-step etching process to remove a stress layer from a transistor, in which the magnitude of the etching process can be easily controlled. By using the two-step etching process, the problem of over-etching the salicide layer formed on the surface of the substrate can be prevented.

According to another embodiment of the present invention, the region connecting the high tensile stress film and the high compressive stress film is also removed during the process for fabricating a dual contact etch stop layer. By forming a gap between the two stress layers, phenomenon such as peeling as a result of staking one stress layer on top of another can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
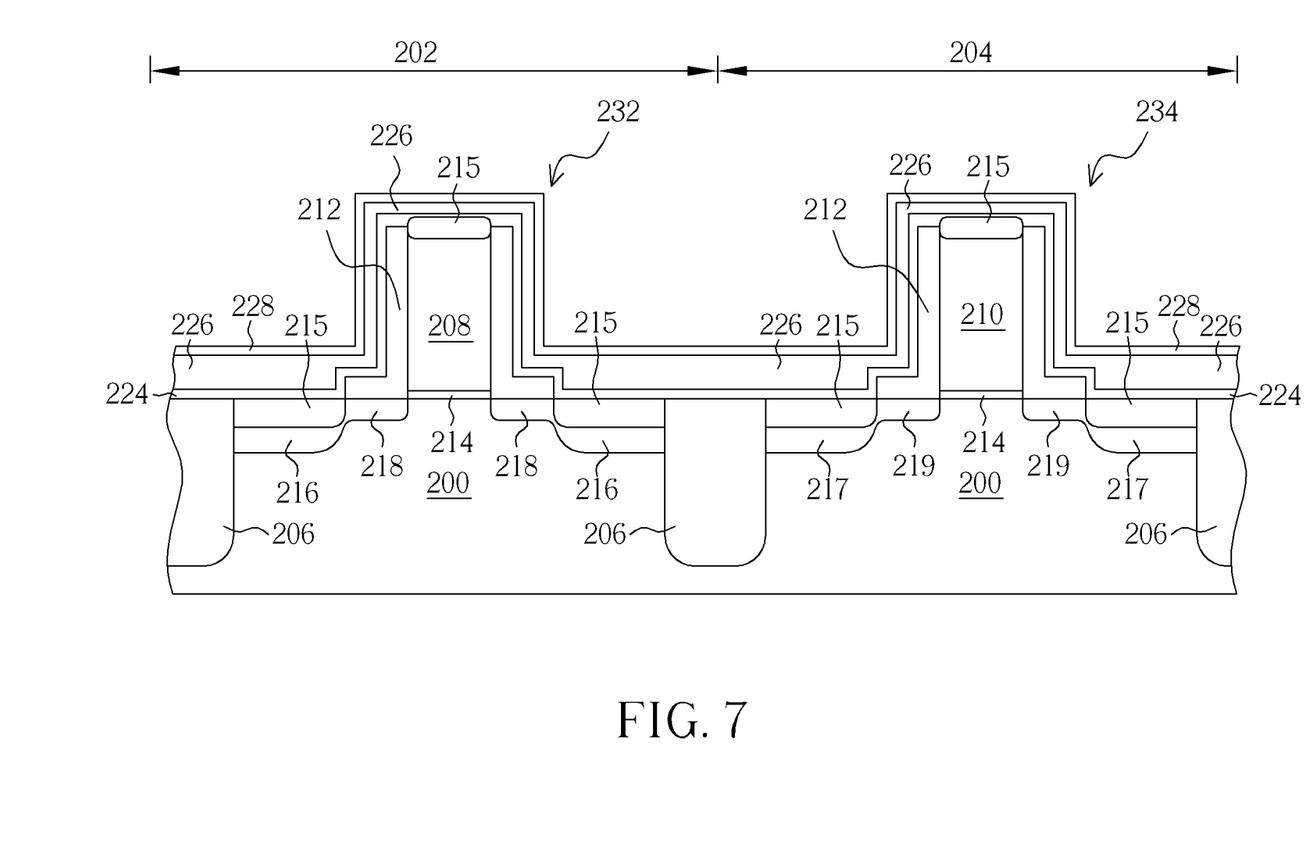
FIGS. 7-13 are perspective diagrams illustrating a method for fabricating dual contact etch stop layer on a strained-silicon CMOS transistor according to the present invention.

Please refer to FIGS. 7-13. FIGS. 7-13 are perspective diagrams illustrating a method for fabricating dual contact etch stop layer on a strained-silicon CMOS transistor according to the present invention. As shown in FIG. 7, a semiconductor substrate 200 having an NMOS region 202 and a PMOS region 204 is provided, in which the NMOS region 202 and the PMOS region 204 are divided by a shallow trench isolation 206. Each of the NMOS region 202 and the PMOS region 204 includes a gate structure. The NMOS gate structure includes an NMOS gate 208 and a gate dielectric 214 disposed between the NMOS gate 208 and the semiconductor substrate 200. The PMOS gate structure includes a PMOS gate 210 and a gate dielectric 214 disposed between the PMOS gate 210 and the semiconductor substrate 200. The sidewall of the NMOS gate 208 and the PMOS gate 210 includes a liner 212 composed of silicon dioxide or silicon nitride.

Next, an ion implantation process is performed to form a source/drain region 216 around the NMOS gate 208 and a source/drain region 217 around the PMOS gate 210 and within the semiconductor substrate 200. A rapid thermal annealing process is performed thereafter to utilize a temperature between 900° C. to 1050° C. to active the dopants within the source/drain region 216 and 217 for forming an NMOS transistor 232 in the NMOS region 202 and a PMOS transistor 234 in the PMOS region 204, and repair the lattice structure of the semiconductor substrate 200, which has been damaged during the ion implantation process. Additionally, a lightly doped drain (LDD) 218 and 219 can be formed between the source/drain region 216, 217 and the gate 208, 210.

Next, a metal layer (not shown), such as a nickel layer is sputtered on the surface of the semiconductor substrate 200, and a rapid thermal annealing process is performed to react the metal layer with the NMOS gate 208, the PMOS gate 210, and the source/drain region 216 and 217 to form a plurality of silicide layers 215.

After removing the un-reacted metal layer, a first etching stop layer 224 is disposed on the surface of the NMOS transistor 232, the PMOS transistor 234, and the shallow trench isolation 206. Next, a plasma enhanced chemical vapor deposition (PECVD) process is performed to form a high tensile stress film 226 over the surface of the first etching stop layer 224, and a second etching stop layer 228 is formed on the high tensile stress film 226 thereafter to form a tri-layer structure. Preferably, the first etching stop layer 224 and the second etching stop layer 228 are composed of silicon dioxide and the high tensile stress film 226 is composed of silicon nitride.

Figure 8:
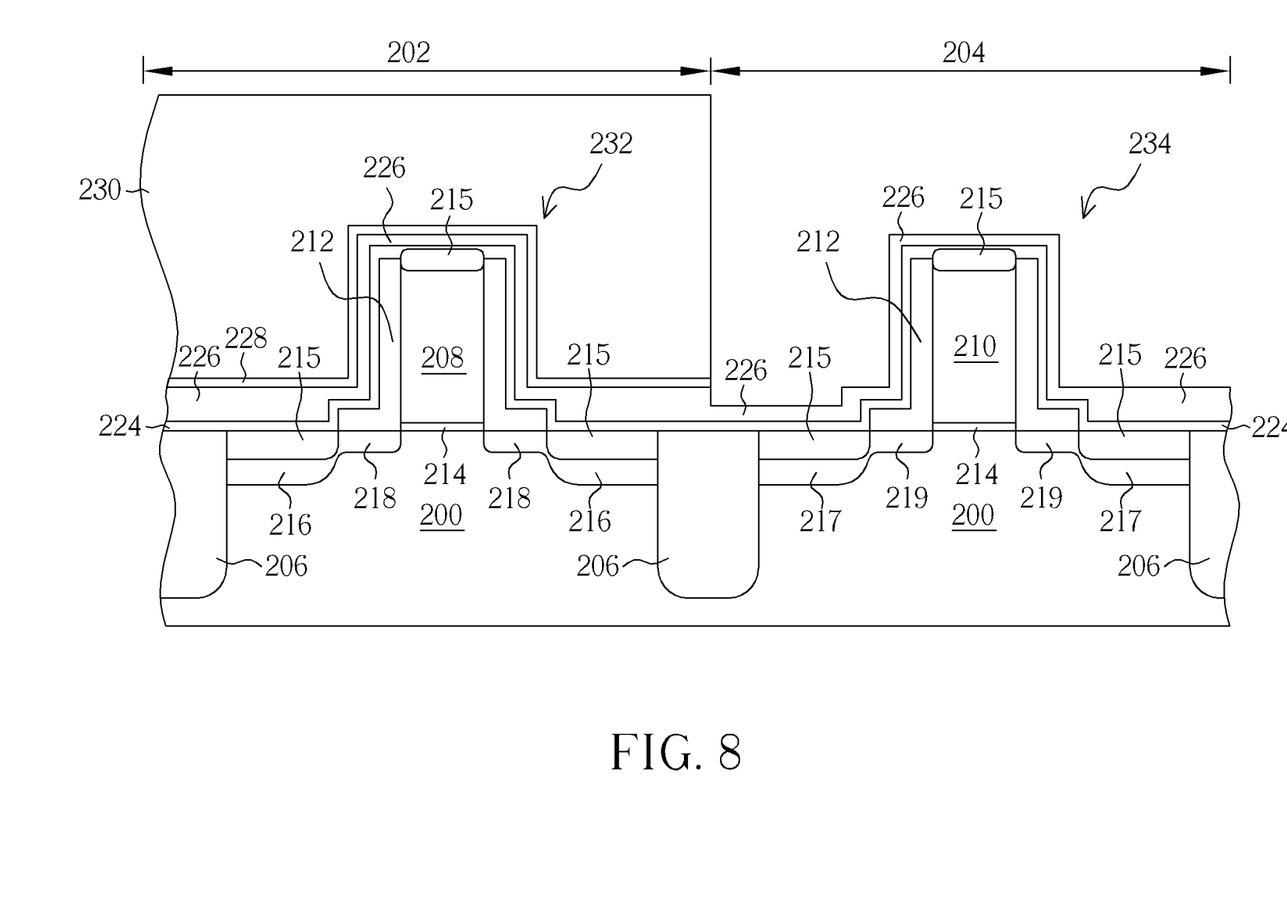

As shown in FIG. 8, a series of coating, exposure, and development processes are performed to form a patterned photoresist 230 in the NMOS region 202. An etching process is performed by using the patterned photoresist 230 as a mask to remove the second etching stop layer 228 and a portion of the high tensile stress film 226 disposed in the PMOS region 204.

Figure 9:
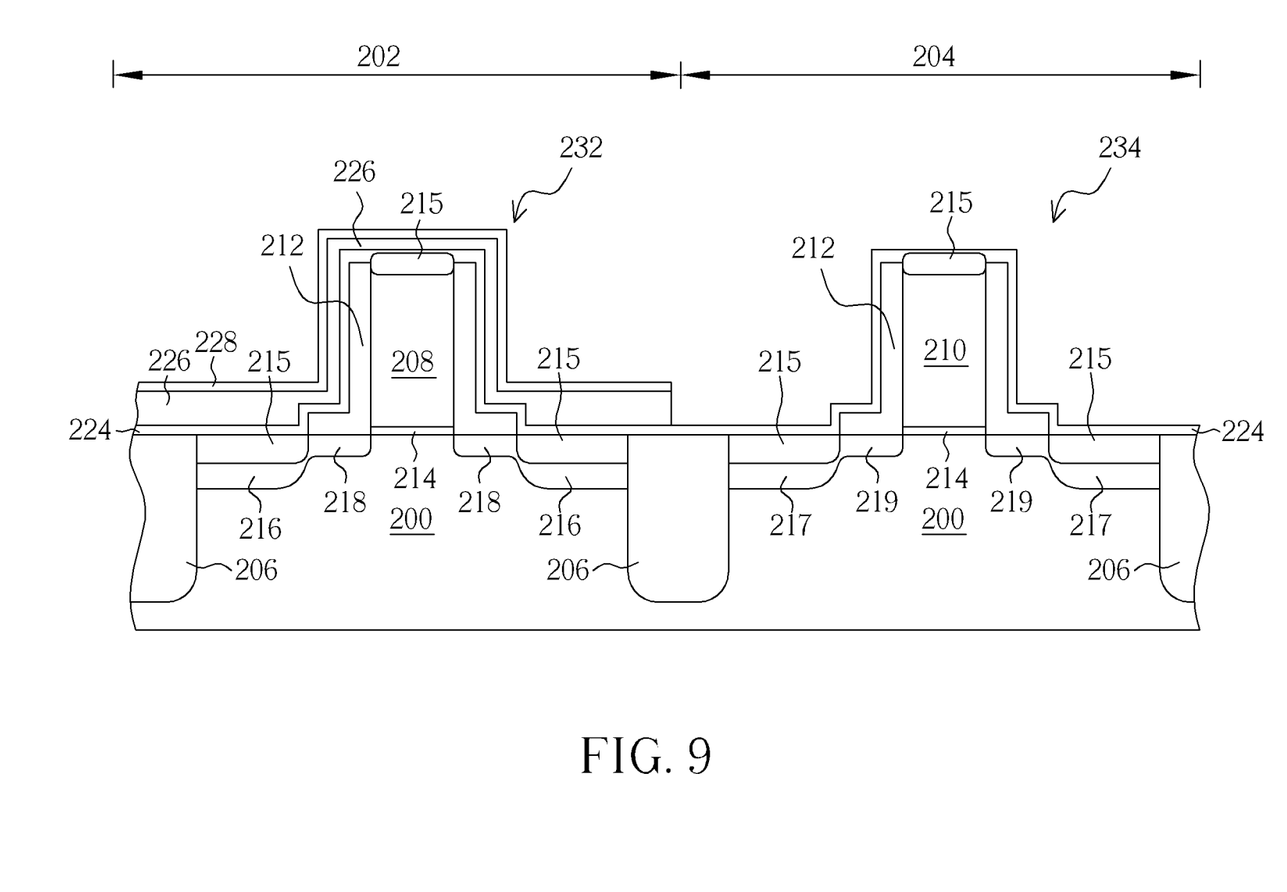

After stripping the patterned photoresist 230, as shown in FIG. 9, the second etching stop layer 228 in the NMOS region 202 is used as a mask to remove the remaining high tensile stress film 226 in the PMOS region 204 and a portion of the first etching stop layer 224. According to the preferred embodiment of the present invention, methyl fluoride ($CH_3F$) can be used as a control agent for controlling the magnitude of the etching process, such that the etching process can be stopped on the first etching stop layer 224.

Figure 10:
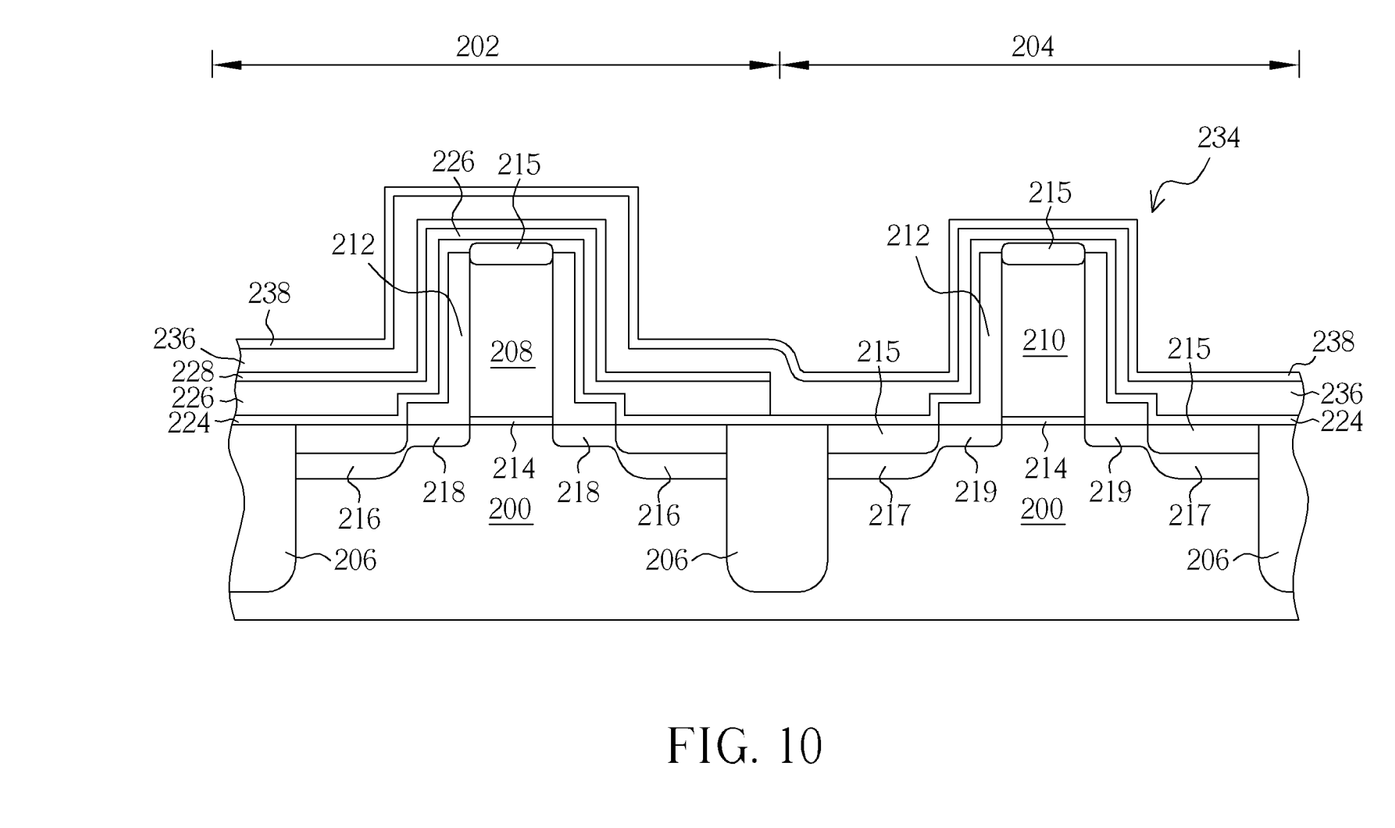

As shown in FIG. 10, another plasma enhanced chemical vapor deposition process is performed to form a high compressive stress film 236 in the NMOS region 202 and the PMOS region 204. The high compressive stress film 236 disposed in the NMOS region 202 is formed above the second etching stop layer 228, whereas the high compressive stress film 236 disposed in the PMOS region 204 is formed on the first etching stop layer 224. A third etching stop layer 238 is disposed on the high compressive stress film 236 thereafter.

Figure 11:
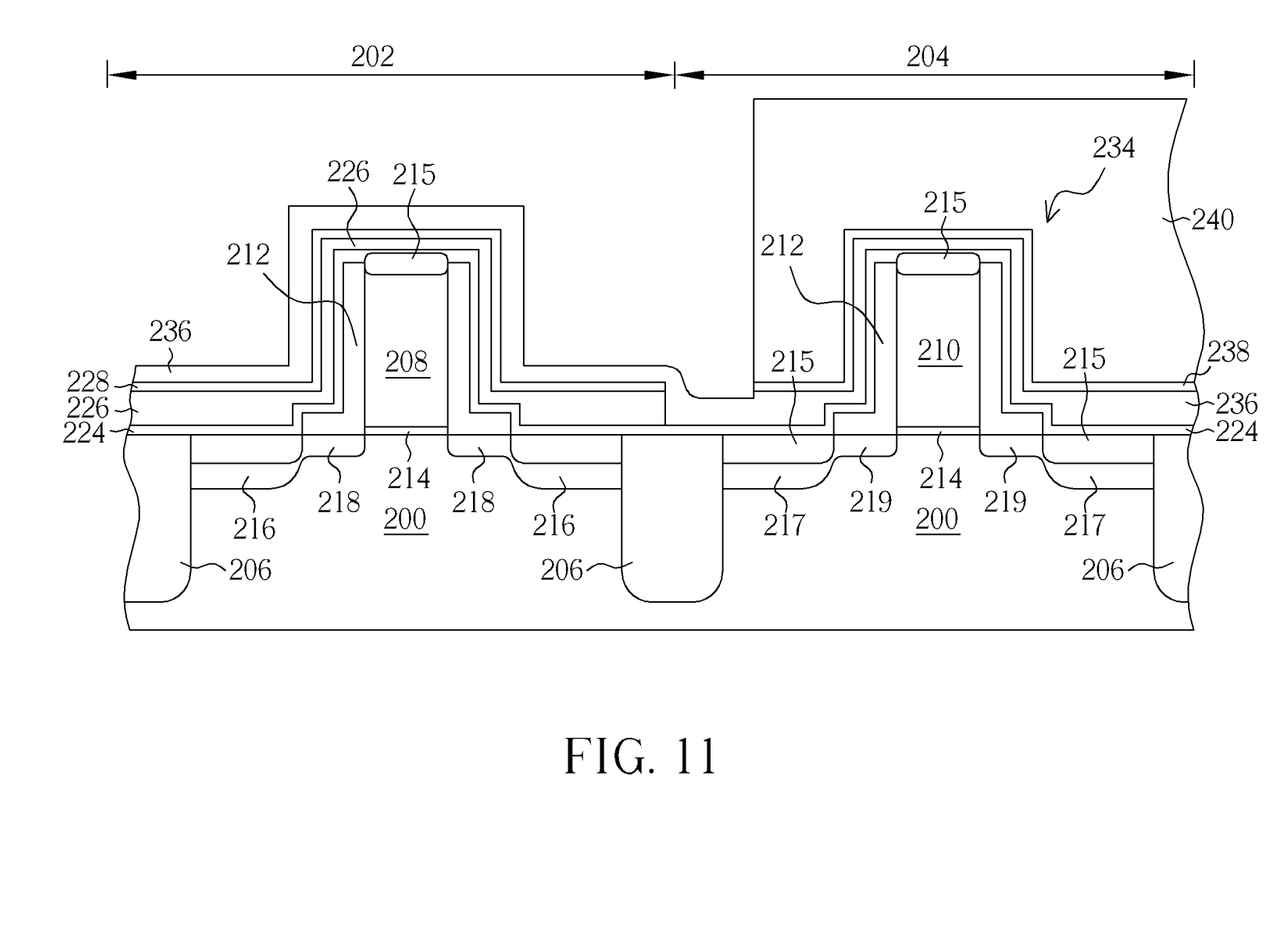

As shown in FIG. 11, a series of coating exposure, and development process are performed to form a patterned photoresist 240 in the PMOS region 204, and an etching process is performed by using the patterned photoresist 240 as a mask to remove the third etching stop layer 238 and a portion of the high compressive stress film 236 in the NMOS region 202.

Figure 12:
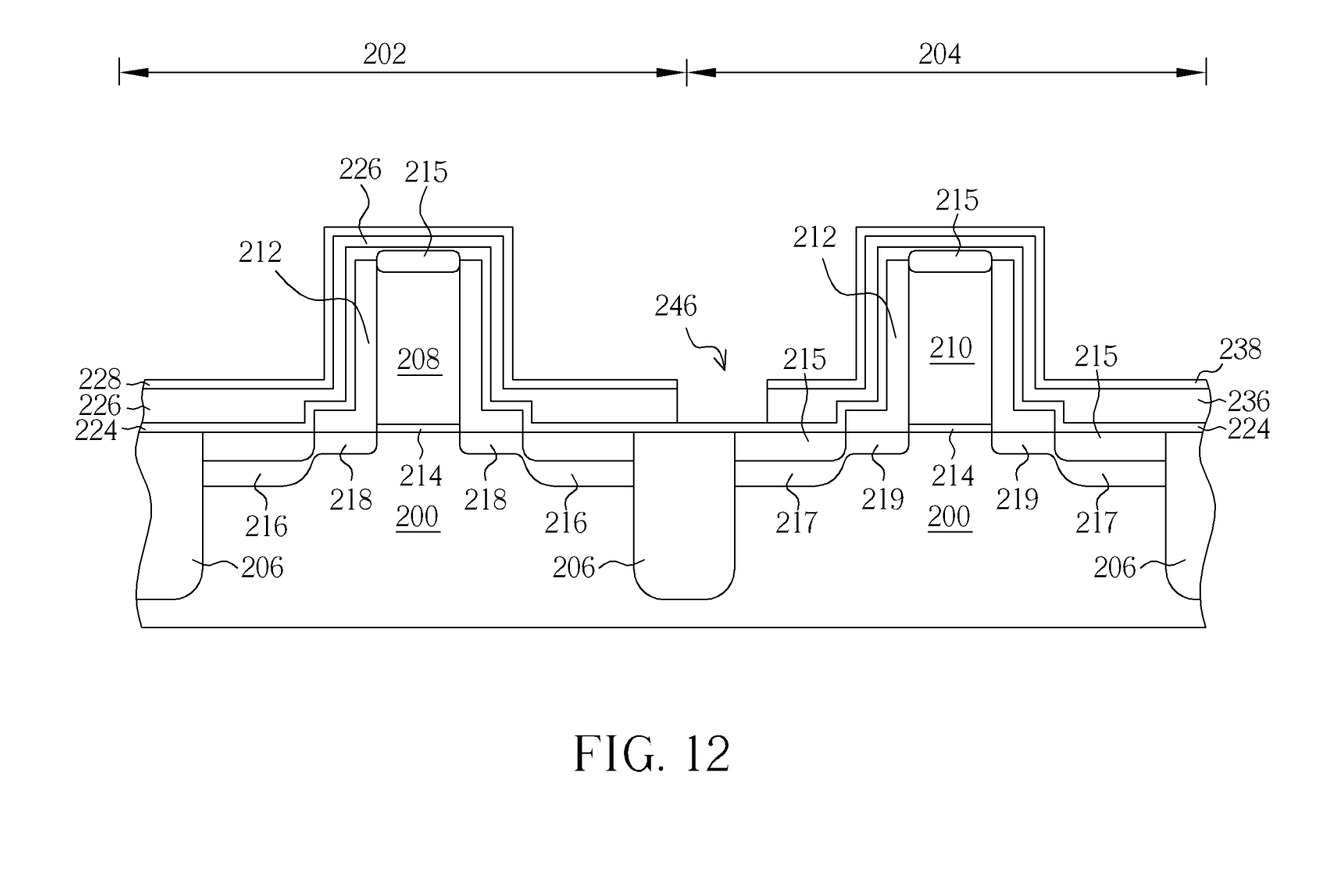

After stripping the patterned photoresist 240, as shown in FIG. 12, an etching process is performed by using the third etching stop layer 238 in the PMOS region 204 as a mask to remove the remaining high compressive stress film 236 in the NMOS region 202 and the high compressive stress film 236 disposed in the junction region of the NMOS region 202 and the PMOS region 204. The removal of the high compressive stress film 236 in the junction region would result in an opening 246. As a result of the etching process being performed, two sides of the opening 246 would demonstrate a slant with different degree of inclination. In the present embodiment, the edge of the opening 246 adjacent to the PMOS transistor 204 would appear an inclined surface as a result of single etching process. As described above, methyl fluoride can be injected as a control agent to control the magnitude of the etching process. For instance, methyl fluoride can be injected during the etching process is performed to remove a portion of the first etching stop layer 224 till the remaining first etching stop layer is 20 angstroms in depth. The remaining first etching stop layer 20 can be used for protecting the salicide layer 215 formed on the substrate 200 of the PMOS region 204.

Figure 13:
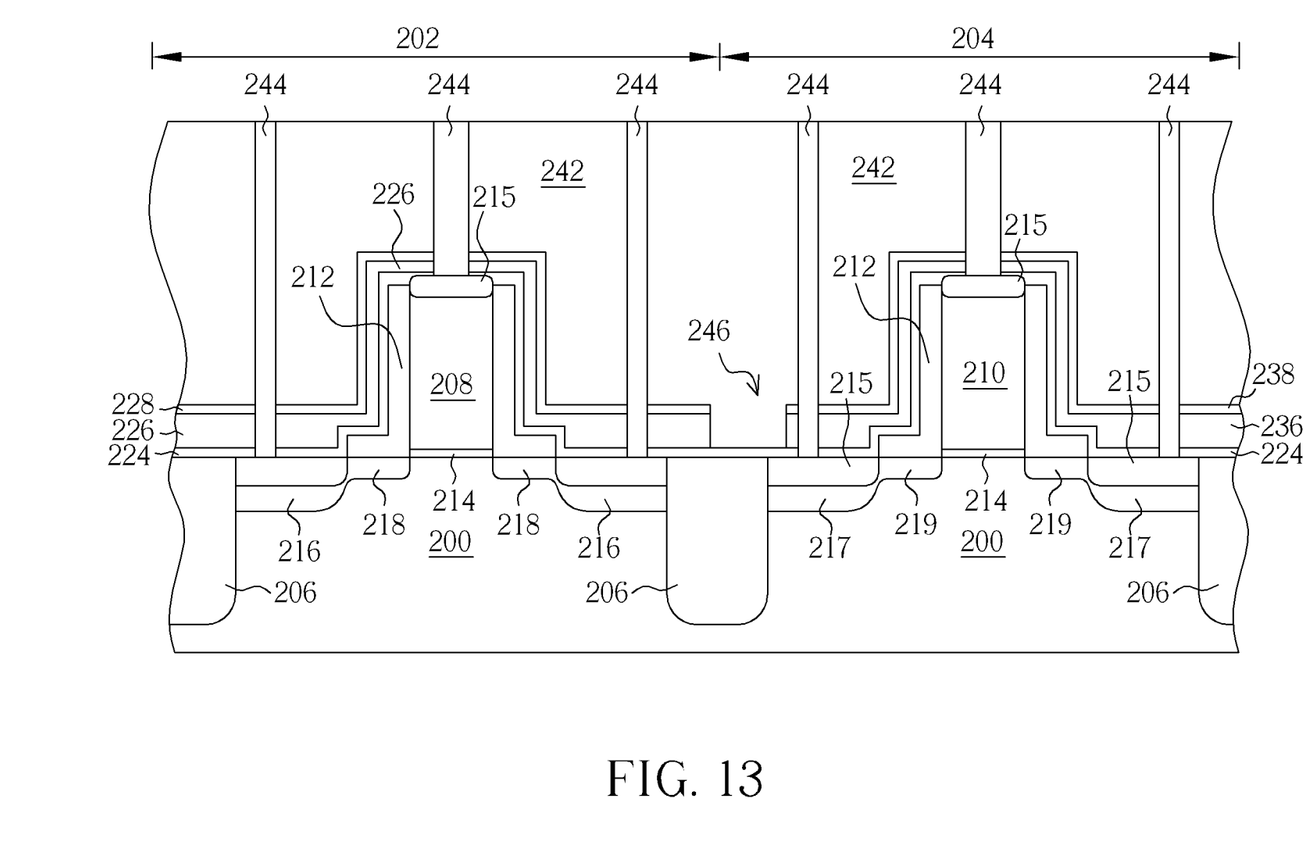

As shown in FIG. 13, an inter-layer dielectric 242 is disposed on the second etching stop layer 228 of the NMOS region 202 and the third etching stop layer 238 of the PMOS region 204. An etching process is performed thereafter by using a patterned photoresist (not shown) as a mask to remove a portion of the inter-layer dielectric 242, the second etching stop layer 228, the third etching stop layer 238, the high tensile stress film 226, the high compressive stress film 236, and the first etching stop layer 224 for forming a plurality of contact holes 244 in the inter-layer dielectric 242.

Figure 14:
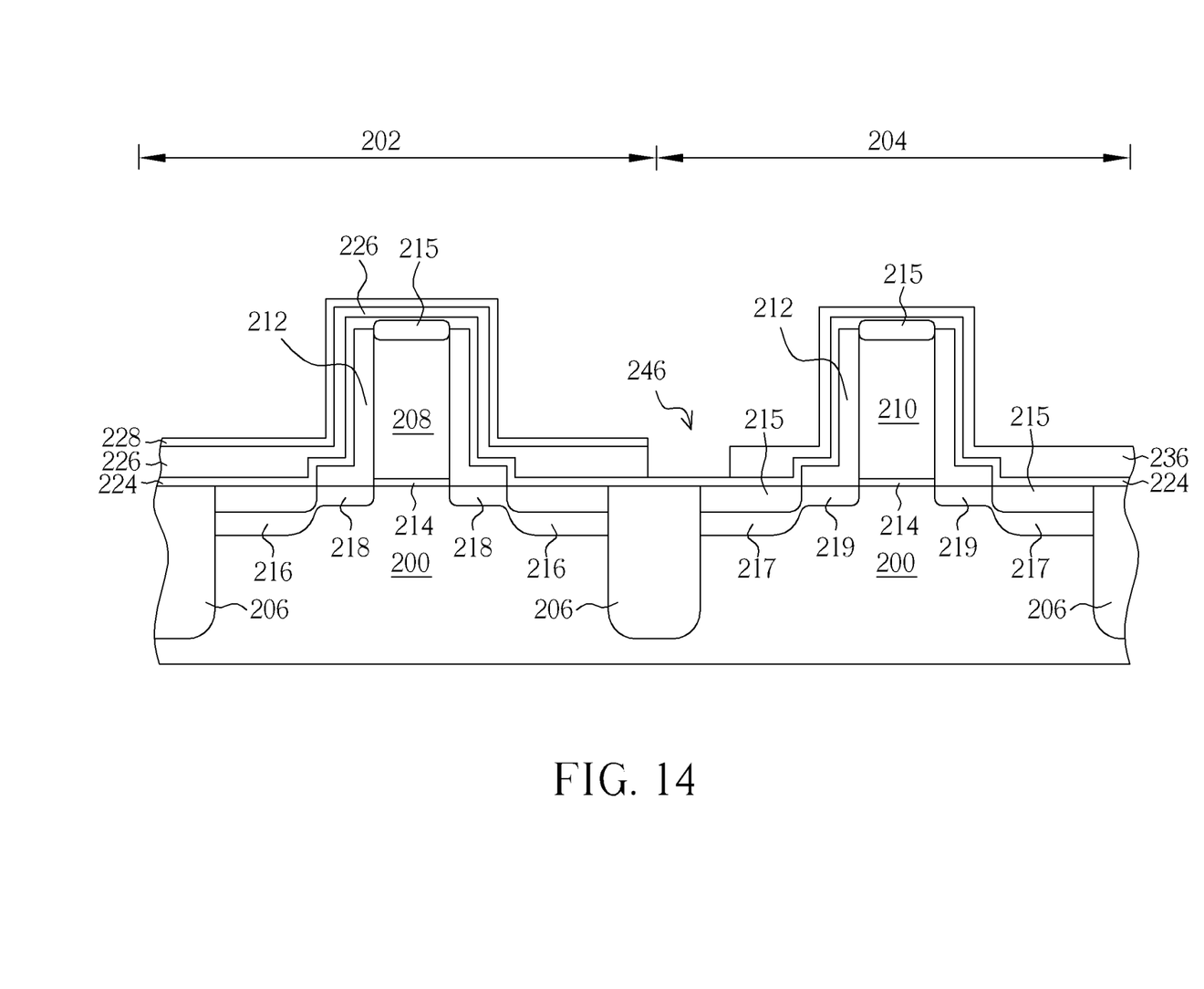
FIG. 14 illustrates a perspective view for fabricating dual contact etch stop layer on a strained-silicon CMOS transistor according to an embodiment of the present invention.

According to another embodiment of the present invention, a dual layer structure can be formed on the PMOS transistor after a tri-layer structure is formed on the NMOS transistor. For instance, after a tri-layer structure composed of the first etching stop layer 224, the high tensile stress film 226, and the second etching stop layer 228 is formed on the NMOS transistor 232, a high compressive stress film 236 is formed on the second etching stop layer 228 of the NMOS region 202 and the first etching stop layer 224 of the PMOS region 204. An etching process is then conducted to remove the high compressive stress film 236 disposed between the NMOS region 202 and the PMOS region 204, as shown in FIG. 14. This forms an opening 246 between the high tensile stress film 226 of the NMOS region 202 and the high compressive stress film 236 of the PMOS region 204, in which the opening 246 exposes the surface of the first etching stop layer 224. The result forms a tri-layer structure composed of the first etching stop layer, the high tensile stress film, and the second etching stop layer on the NMOS transistor and a dual layer structure composed of the high compressive stress film and the first etching stop layer on the PMOS transistor. Thereafter, an inter-layer dielectric and a plurality of contact holes described in the aforementioned embodiment can be formed on the NMOS transistor 232 and the PMOS transistor 234. It should be noted that the first etching stop layer 224 may be removed during the fabrication process, hence a high compressive stress film 236 can be disposed directly on the PMOS transistor 234 for forming a single layer structure, which are all within the scope of the present invention.

Overall, in contrast to the conventional means of fabricating strained-silicon CMOS transistors, the present invention forms a first etching stop layer, a stress layer, and a second etching stop layer on a first transistor and a second transistor, disposes a patterned photoresist on the first transistor, and uses the patterned photoresist as a mask to remove the second etching stop layer and a portion of the stress layer from the second transistor. After removing the patterned photoresist, the second etching stop layer on the first transistor is used as a mask to remove the remaining stress layer on the second transistor. In other words, in contrast to the conventional method of using a single step etching method, the present invention proposes a two-step etching process to remove a stress layer from a transistor, in which the magnitude of the etching process can be easily controlled. By using the two-step etching process, the problem of over-etching the salicide layer formed on the surface of the substrate can be prevented.

According to another aspect of the present invention, the stress layer is first formed on the NMOS transistor and formed on the PMOS transistor thereafter. Due to the fact that nickel silicides formed on the NMOS transistor are easily oxidized during the stripping process of the photoresist, a stress layer is formed to protect such region for preventing the oxidation of nickel silicides.

Additionally, according to the aforementioned embodiment, a tri-layer structure can be formed on the NMOS transistor and a dual layer structure or a single layer structure can be formed on the PMOS transistor. Preferably, a tri-layer structure is formed on the NMOS transistor to protect the nickel silicide region from oxidation, and a dual layer composed of a stress layer and an etching stop layer or a single layer structure composed only a stress layer is formed on the PMOS transistor, in which a gap is formed between the stress layer of the NMOS region and the PMOS region.

According to another embodiment of the present invention, the region connecting the high tensile stress film and the high compressive stress film is also removed during the process for fabricating a dual contact etch stop layer. By forming a gap between the two stress layers, phenomenon such as peeling as a result of staking one stress layer on top of another can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a strained-silicon CMOS transistor, comprising:
   providing a semiconductor substrate having a first active region for fabricating a first transistor, a second active region for fabricating a second transistor, and an isolation structure disposed between the first active region and the second active region;
   forming a source / drain region for the first transistor and a source / drain region for the second transistor;
   forming a first etching stop layer, a first stress layer, and a second etching stop layer on the first transistor, the second transistor, and the isolation structure;
   forming a first patterned photoresist on the second etching stop layer of the first active region;
   performing a first etching process to completely remove the second etching stop layer and remove a portion of the first stress layer of the second active region;
   removing the first patterned photoresist after the first etching process is performed;
   performing a second etching process by utilizing the second etching stop layer of the first active region as a mask to remove the remaining first stress layer of the second active region after the first patterned photoresist is removed;
   forming a second stress layer on the second etching stop layer of the first active region and the first etching stop layer of the second transistor of the second active region after performing the second etching process;
   forming a third etching stop layer on the second stress layer;
   forming a second patterned photoresist on the third etching stop layer of the second active region;
   performing a third etching process to remove the third etching stop layer and a portion of the second stress layer of the first active region;
   removing the second patterned photoresist after performing the third etching process; and
   performing a fourth etching process after removing the second patterned photoresist by utilizing the third etching stop layer of the second active region as a mask to remove the remaining second stress layer of the first active region and the second stress layer between the first active region and the second active region.

2. The method for fabricating a strained-silicon CMOS transistor of claim 1, wherein the first transistor comprises an NMOS transistor and the second transistor comprises a PMOS transistor.

3. The method for fabricating a strained-silicon CMOS transistor of claim 1, wherein the first stress layer is a high tensile stress film.

4. The method for fabricating a strained-silicon CMOS transistor of claim 1 further comprising utilizing methyl fluoride ($CH_3F$) for controlling the magnitude of the second etching process.

5. The method for fabricating a strained-silicon CMOS transistor of claim 1 further comprising:
   depositing a metal layer on the first transistor and the second transistor;
   performing a rapid thermal anneal process to form a salicide layer on the first transistor and the second transistor; and
   removing the un-reacted metal layer.

6. The method for fabricating a strained-silicon CMOS transistor of claim 1 further comprising: forming a gap between the first stress layer and the second stress layer.

7. The method for fabricating a strained-silicon CMOS transistor of claim 1 further comprising utilizing methyl fluoride ($CH_3F$) for controlling the magnitude of the second etching process.

8. The method for fabricating a strained-silicon CMOS transistor of claim 1, wherein the second stress layer is a high compressive stress film.

9. The method for fabricating a strained-silicon CMOS transistor of claim 1 further comprising removing a portion of the first etching stop layer of the second active region, such that the remaining first etching stop layer comprises a depth of 20 angstroms.

10. The method for fabricating a strained-silicon CMOS transistor of claim 1 further comprising:
   depositing a dielectric layer on the second etching stop layer and the third etching stop layer after performing the fourth etching process; and
   performing an etching process to remove a portion of the dielectric layer, the second etching stop layer, the third etching stop layer, the first stress layer, the second stress layer, and the first etching stop layer to form a plurality of contact holes.

* * * * *